US008610458B2

(12) United States Patent
Lee

(10) Patent No.: US 8,610,458 B2
(45) Date of Patent: Dec. 17, 2013

(54) IMPEDANCE CONTROL CIRCUIT AND SEMICONDUCTOR DEVICE INCLUDING THE SAME

(75) Inventor: Ji-Wang Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/446,527

(22) Filed: Apr. 13, 2012

(65) Prior Publication Data

US 2013/0113515 A1    May 9, 2013

(30) Foreign Application Priority Data

Nov. 8, 2011  (KR) .................. 10-2011-0116070

(51) Int. Cl.
*H03K 19/003* (2006.01)
*H03L 5/00* (2006.01)

(52) U.S. Cl.
USPC .............................. 326/30; 327/77; 327/308

(58) Field of Classification Search
USPC ........................................................ 326/30
See application file for complete search history.

(56) References Cited

U.S. PATENT DOCUMENTS

| | | | |
|---|---|---|---|
| 6,307,424 B1 * | 10/2001 | Lee ............................... | 327/530 |
| 6,418,500 B1 * | 7/2002 | Gai et al. ........................ | 710/305 |
| 7,439,789 B2 * | 10/2008 | Nguyen ......................... | 327/308 |
| 8,063,658 B2 * | 11/2011 | Gillingham ................... | 326/30 |
| 8,278,968 B2 * | 10/2012 | Nguyen et al. ................ | 326/30 |

FOREIGN PATENT DOCUMENTS

| KR | 1020090061312 | 6/2009 |
|---|---|---|
| KR | 1020100006887 | 1/2010 |

OTHER PUBLICATIONS

Thomas F. Knight Jr. and Alexander Krymm. A Self-Terminating Low-Voltage Swing CMOS Output Driver. IEEE Journal of Solid-State Circuits, 23(2), Apr. 1988.*

* cited by examiner

*Primary Examiner* — Shawki Ismail
*Assistant Examiner* — Nelson Correa
(74) *Attorney, Agent, or Firm* — IP & T Group LLP

(57) ABSTRACT

An impedance control circuit includes a first impedance unit configured to terminate an impedance node using an impedance value that is determined by an impedance control code, a second impedance unit configured to terminate the impedance node using an impedance value that is determined by an impedance control voltage, a comparison circuit configured to compare a voltage level of the impedance node and a voltage level of a reference voltage, generate an up/down signal indicating whether the voltage at the impedance node is greater than the reference voltage, and generate the impedance control voltage that has a voltage level corresponding to a difference between the voltage at the impedance node and the reference voltage, and a counter unit configured to increase or decrease a value of the impedance control code in response to the up/down signal.

24 Claims, 7 Drawing Sheets

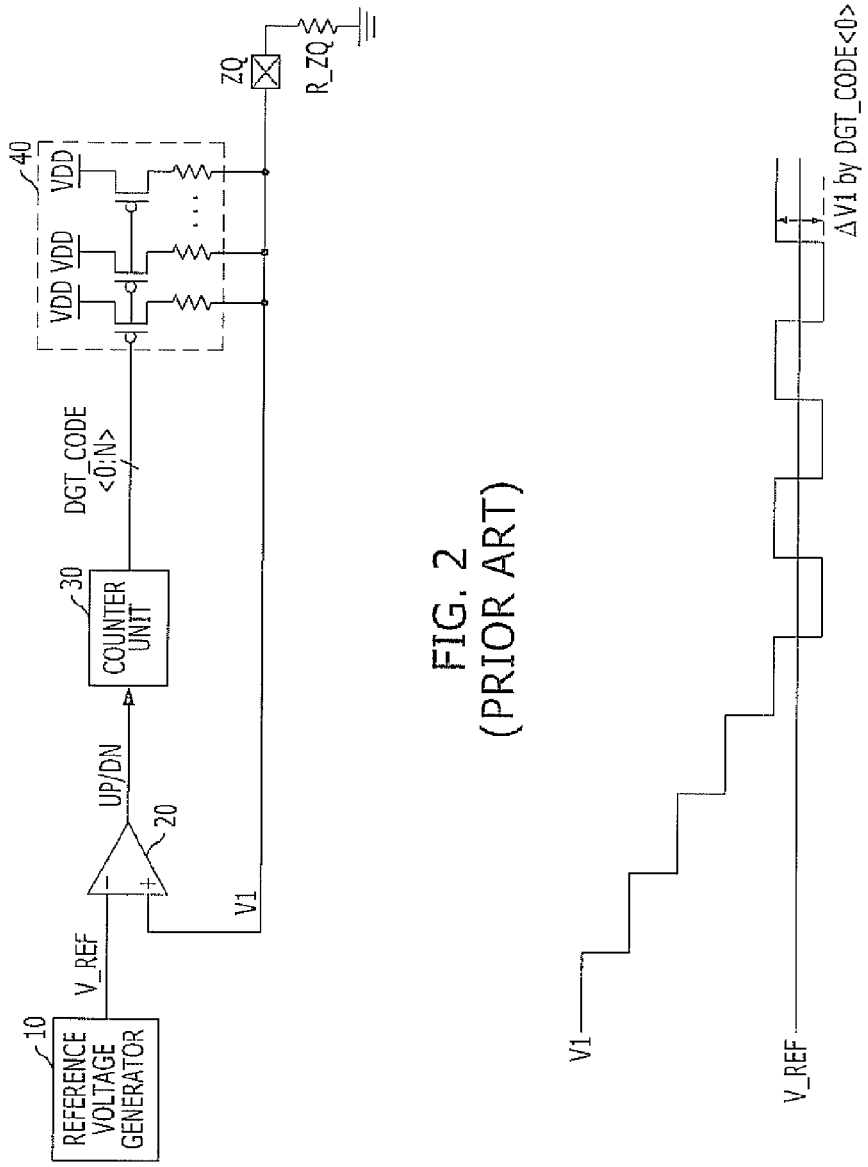

IMPEDANCE CONTROL CIRCUIT AND SEMICONDUCTOR DEVICE INCLUDING THE SAME

CROSS-REFERENCE TO RELATED APPLICATIONS

The present application claims priority of Korean Patent Application No. 10-2011-0116070, filed on Nov. 8, 2011, which is incorporated herein by reference in its entirety.

BACKGROUND

1. Field

Exemplary embodiments of the present invention relate to an impedance control circuit that generates an impedance control code for controlling an impedance value, and a semiconductor device that determines the termination impedance value of an interface pad using the generated impedance control code.

2. Description of the Related Art

As a semiconductor device may operate at a high speed, the swing between logical voltage levels of a signal exchanged between semiconductor devices is decreased to minimize a delay time induced in a signal transmission procedure. However, as the swing between logical voltage levels of a signal is decreased, influence of noise increases, and a reflection of a signal due to an impedance mismatch on an interface between semiconductor devices may impact a semiconductor operation. The impedance mismatch is caused due to external noise, variations in power supply voltage, operating temperature, a change in manufacturing process, etc. Due to the impedance mismatch, high speed transmission of data becomes difficult and output data may be distorted.

Therefore, in a semiconductor device that operates at a high speed, a termination circuit is adopted adjacent to an input pad of a chip. The termination circuit is called an on-die termination circuit. In general, in an on-die termination scheme, a transmission unit performs source termination by an output circuit, and a reception unit performs parallel termination through a termination circuit that is connected in parallel to a reception circuit connected with the input pad.

ZQ calibration is a procedure performed in a ZQ node as a node for calibration, and ZQ calibration is a procedure for generating calibration codes that change according to PVT (process, voltage and temperature) conditions. Using the codes generated as a result of ZQ calibration, the impedance value of a termination circuit, more specifically, the impedance value of an interface pad (for example, an input/output pad) in a semiconductor memory device is controlled.

FIG. 1 illustrates a conventional ZQ calibration circuit.

Referring to FIG. 1, the conventional ZQ calibration circuit includes a reference voltage generator 10, a comparison unit 20, a counter unit 30, and an impedance unit 40.

A reference voltage generator 10 outputs a reference voltage V_REF. The comparison unit 20 compares the level of the reference voltage V_REF and the level of a voltage V1 of an impedance node, generates an up/down signal UP/DN indicating whether the reference voltage V_REF or the voltage V1 is greater, and outputs the up/down signal UP/DN to the counter unit 30. The counter unit 30 performs a counting operation of increasing or decreasing the value of a impedance control code DGT_CODE<0:N> in response to the up/down signal UP/DN. The controlled impedance control code DGT_CODE<0:N> are outputted to the impedance unit 40. The impedance unit 40 performs termination for the impedance node with the impedance value determined by the impedance control code DGT_CODE<0:N>. This procedure is repeated until the level of the voltage V1 at the impedance node becomes the same as the level of the reference voltage V_REF.

FIG. 2 illustrates a procedure where the voltage V1 at the impedance node approaches the reference voltage V_REF by calibration operations shown in FIG. 1.

Referring to FIG. 2, since a plurality of impedances constituting the impedance unit 40 are controlled by the impedance control code DGT_CODE<0:N> as digital signals, a bang-bang error occurs. The bang-bang error indicates a phenomenon where the voltage at the impedance node does not precisely correspond to the level of the reference voltage V_REF during a calibration operation, and the voltage at the impedance node rises and falls in a stepwise manner when viewed with respect to the reference voltage V_REF.

Consequently, as the calibration operation is performed using the impedance control code DGT_CODE<00:N> as digital signals, the level of the voltage V1 at the impedance node is difficult to control to precisely correspond to the level of the reference voltage V_REF, as in the case of occurrence of a bang-bang error.

SUMMARY

Embodiments of the present invention are directed to an impedance control circuit that can prevent the occurrence of a bang-bang error while using a reduced area and can precisely calibrate impedance, and a semiconductor device including the same.

In accordance with an embodiment of the present invention, an impedance control circuit includes: a first impedance unit configured to terminate an impedance node using an impedance value that is determined by an impedance control code; a second impedance unit configured to terminate the impedance node using an impedance value that is determined by an impedance control voltage; a comparison circuit configured to compare a voltage level of the impedance node and a voltage level of a reference voltage, generate an up/down signal indicating whether the voltage at the impedance node is greater than the reference voltage, and generate the impedance control voltage that has a voltage level corresponding to a difference between the voltage at the impedance node and the reference voltage; and a counter unit configured to increase or decrease a value of the impedance control code in response to the up/down signal.

In accordance with another embodiment of the present invention, impedance control circuit includes: a first impedance unit configured to terminate an impedance node using an impedance value that is determined by a first group of bits of an impedance control code; a second impedance unit configured to terminate the impedance node using an impedance value that is determined in response to one of a remaining bit of the impedance control code not included in the first group of bits and an impedance control voltage; a comparison circuit configured to compare a voltage level of the impedance node and a voltage level of a reference voltage, generate an up/down signal indicating whether the voltage at the impedance node is greater than the reference voltage, and generate the impedance control voltage that has a voltage level corresponding to a difference between the voltage levels of the impedance node and the reference voltage; and a counter unit configured to increase or decrease a value of the impedance control code in response to the up/down signal.

In accordance with another embodiment of the present invention, an impedance control circuit includes: a first pull-up impedance unit configured to pull-up drive an impedance node using an impedance value that is determined by a pull-up impedance control code; a second pull-up impedance unit configured to pull-up drive the impedance node using an impedance value that is determined by a pull-up impedance control voltage; a first dummy pull-up impedance unit configured in the same manner as the first pull-up impedance unit to pull-up drive a first node; a second dummy pull-up impedance unit configured in the same manner as the second pull-up impedance unit to pull-up drive the first node; a first pull-down impedance unit configured to pull-down drive the first node using an impedance value that is determined by a pull-down impedance control code; a second pull-down impedance unit configured to pull-down drive the first node using an impedance value that is determined by a pull-down impedance control voltage; a pull-up comparison circuit configured to compare a voltage level of the impedance node and a voltage level of a reference voltage, generate a first up/down signal indicating whether the voltage at the impedance node is greater than the reference voltage, and generate the pull-up impedance control voltage that has a voltage level corresponding to a difference between the voltage at the impedance node and the reference voltage; a pull-down comparison circuit configured to compare a voltage level of the first node and the voltage level of the reference voltage, generate a second up/down signal indicating whether the voltage at the first node is greater than the reference voltage, and generate the pull-down impedance control voltage that has a voltage level corresponding to a difference between the voltage of the first node and the reference voltage; a pull-up counter unit configured to increase or decrease a value of the pull-up impedance control code in response to the first up/down signal; and a pull-down counter unit configured to increase or decrease a value of the pull-down impedance control code in response to the second up/down signal.

In accordance with another embodiment of the present invention, an impedance control circuit includes: a first pull-up impedance unit configured to pull-up drive an impedance node using an impedance value that is determined by a first group of bits of a pull-up impedance control code; a second pull-up impedance unit configured to pull-up drive the impedance node using an impedance value that is determined in response to one of a remaining bit of the pull-up impedance control code not included in the first group of bits of the pull-up impedance control code and a pull-up impedance control voltage; a first dummy pull-up impedance unit configured in the same manner as the first pull-up impedance unit to pull-up drive a first node; a second dummy pull-up impedance unit configured in the same manner as the second pull-up impedance unit to pull-up drive the first node; a first pull-down impedance unit configured to pull-down drive the first node using an impedance value that is determined by a first group of bits of a pull-down impedance control code; a second pull-down impedance unit configured to pull-down drive the first node using an impedance value that is determined in response to one of a remaining bit of the pull-down impedance control code not included in the first group of bits of the pull-down impedance control code and a pull-down impedance control voltage; a pull-up comparison circuit configured to compare a voltage level of the impedance node and a voltage level of a reference voltage, generate a first up/down signal indicating whether the voltage at the impedance node is greater than the reference voltage, and generate the pull-up impedance control voltage that has a voltage level corresponding to a difference between the voltage at the impedance node and the reference voltage; a pull-down comparison circuit configured to compare a voltage level of the first node and the level of the reference voltage, generate a second up/down signal indicating whether the voltage at the first node is greater than the reference voltage, and generate the pull-down impedance control voltage that has a voltage level corresponding to a difference between the voltage of the first node and the reference voltage; a pull-up counter unit configured to increase or decrease a value of the pull-up impedance control code in response to the first up/down signal; and a pull-down counter unit configured to increase or decrease a value of the pull-down impedance control code in response to the second up/down signal.

In accordance with another embodiment of the present invention, a semiconductor device includes: an impedance control circuit configured to generate an impedance control code and an impedance control voltage for determining a termination impedance value; and a termination circuit configured to terminate an interface pad using an impedance value in response to the impedance control code and the impedance control voltage, wherein the impedance control circuit comprises: a first impedance unit configured to terminate an impedance node using an impedance value that is determined by a first group of bits of the impedance control code; a second impedance unit configured to terminate the impedance node using an impedance value that is determined in response to one of a remaining bit of the impedance control code not included in the first group of bits and the impedance control voltage; a comparison circuit configured to compare a voltage level of the impedance node and a voltage level of a reference voltage, generate an up/down signal indicating whether the voltage at the impedance node is greater than the reference voltage, and generate the impedance control voltage that has a voltage level corresponding to a difference between the voltage at the impedance node and the reference voltage; and a counter unit configured to increase or decrease a value of the impedance control code in response to the up/down signal.

BRIEF DESCRIPTION OF THE DRAWINGS

FIG. 1 illustrates a conventional impedance control circuit.

FIG. 2 illustrates a bang-bang error that occurs by an impedance control operation of the impedance control circuit shown in FIG. 1.

DETAILED DESCRIPTION

Figure 3:
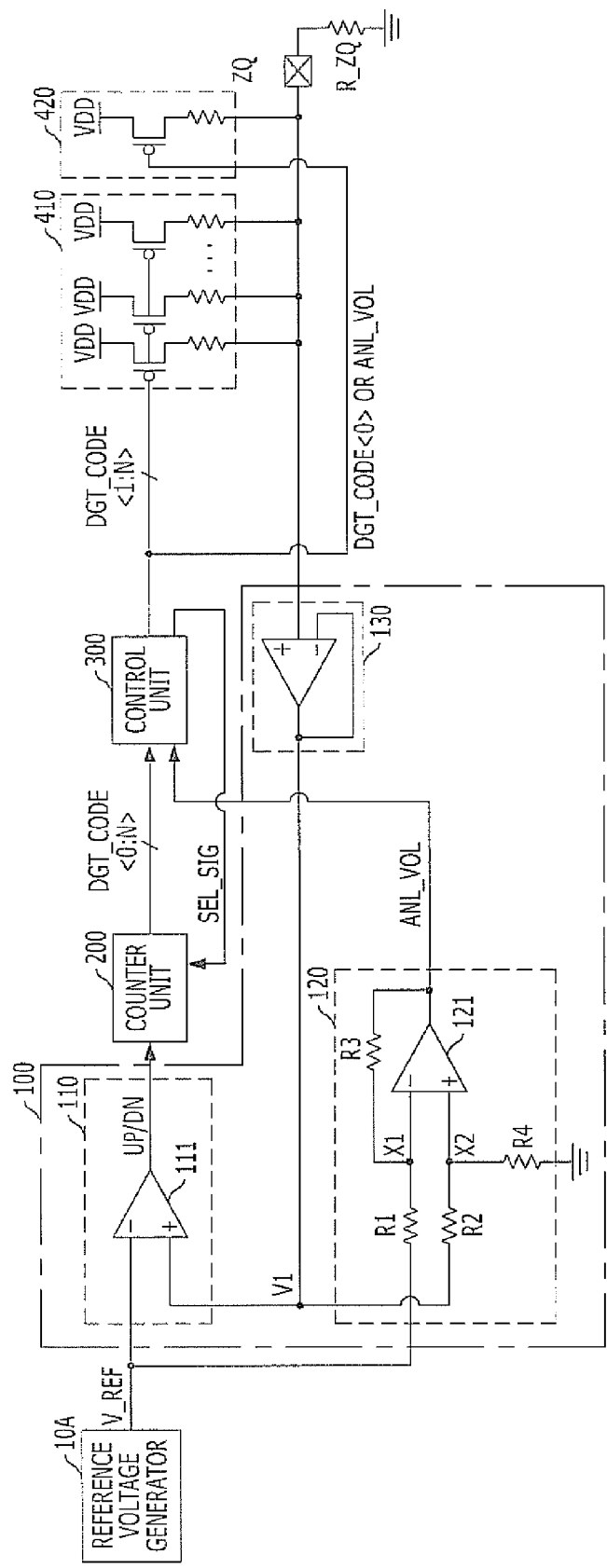
FIG. 3 illustrates an impedance control circuit in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 3 illustrates an impedance control circuit in accordance with a first embodiment of the present invention.

Referring to FIG. 3, the impedance control circuit includes a reference voltage generator 10A, a comparison circuit 100, a counter unit 200, a control unit 300, a first impedance unit 410, and a second impedance unit 420.

The reference voltage generator 10A is configured to generate a reference voltage V_REF and output the reference voltage V_REF to the comparison circuit 100.

The comparison circuit 100 is configured to compare a voltage V1 at an impedance node with the reference voltage V_REF, and the comparison circuit 100 is configured to generate an up/down signal UP/DN, which indicates whether the voltage V1 at the impedance node or the reference voltage V_REF is greater, and an impedance control voltage ANL_VOL, which has a value corresponding to a difference between the voltage V1 at the impedance node and the reference voltage V_REF.

In detail, if the voltage V1 at the impedance node is smaller than the reference voltage V_REF, the comparison circuit 100 outputs the up/down signal UP/DN that has a logical value of 0, and conversely, if the voltage V1 at the impedance node is greater than the reference voltage V_REF, the comparison circuit 100 outputs the up/down signal UP/DN that has a logical value of 1. Further, if the voltage V1 at the impedance node is greater than the reference voltage V_REF, the comparison circuit 100 outputs an impedance control voltage ANL_VOL as an analog signal that corresponds to a value obtained by subtracting the voltage level of the reference voltage V_REF from the voltage level of the voltage V1 at the impedance node. More specifically, the impedance control voltage ANL_VOL with the magnitude of $h*(V1-V\_REF)$ is outputted. In this expression, h is a proportional constant and is determined by the values of resistors constituting the comparison circuit 100. By controlling the value of h, the level of the impedance control voltage ANL_VOL may be controlled. For example, if h is 1, the difference between the inputted level of the voltage V1 at the impedance node and the level of the reference voltage V_REF is outputted as the impedance control voltage ANL_VOL.

Referring to FIG. 3, the comparison circuit 100 may include a first comparison unit 110, a second comparison unit 120, and a voltage transfer unit 130. The first comparison unit 110 is configured to generate the up/down signal UP/DN indicating whether the voltage V1 at the impedance node is greater than the reference voltage V_REF. The second comparison unit 120 is configured to output the analog control voltage ANL_VOL corresponding to the difference between the two input signals.

The first comparison unit 110 includes a first op amp (operational amplifier) 111. The first comparison unit 110 receives the voltage V1 at the impedance node and the reference voltage V_REF, amplifies the difference between the two voltages, and outputs the up/down signal UP/DN as a digital signal with a high or low logical level.

The second comparison unit 120 may include four resistors R1 to R4 and a second op amp 121. The second op amp 121 receives the voltages of a first node X1 and a second node X2 and outputs the analog control voltage ANL_VOL. In detail, the reference voltage V_REF is applied to a first end of the first resistor R1, and a second end of the first resistor R1 is connected with the first node X1. The voltage V1 at the impedance node is applied to a first end of the second resistor R2, and a second end of the second resistor R2 is connected with the second node X2. A first end of the third resistor R3 is connected with the first node X1, and a second end of the third resistor R3 is connected with the output terminal of the second op amp 121. Finally, a ground voltage is applied to a first end of the fourth resistor R4, and a second end of the fourth resistor R4 is connected with the second node X2.

The impedance control voltage ANL_VOL outputted from the second op amp 121 is calculated as follows. First, it is assumed that ① no current is inputted to the (+) terminal and (−) terminal of the second op amp 121, ② the voltage levels of the first node X1 and the second node X2 become the same by a virtual short, and ③ the first to fourth resistors R1 to R4 have the same impedance value. By the assumptions ① and ③, current flowing from the first node X1 to the first resistor R1 and current flowing from the first node X1 to the third resistor R3 have opposite signs and a same magnitude. More specifically, an equation is established as: (the voltage of the first node X1−V_REF)/R1+(the voltage of the first node X1−ANL_VOL)/R3=0. By simplifying the equation using assumption ③, an equation becomes: the voltage of the first node X1=(V_REF+ANL_VOL)/2. Similarly, by the assumptions ① and ③, current flowing from the second node X2 to the second resistor R2 and current flowing from the second node X2 to the fourth resistor R4 have opposite signs and a same magnitude. More specifically; an equation is established as: (the voltage of the second node X2−V_REF)/R2+(the voltage of the second node X2−ANL_VOL)/R4=0. By simplifying the equation using the assumption ③, an equation becomes: the voltage of the second node X2=V1/2.

Since the voltage levels of the first node X1 and the second node X2 are the same by the assumption ②, an equation is established as the voltage level of the first node X1=the voltage level of the second node X2, or more specifically, (V_REF+ANL_VOL)/2=V1/2. By simplifying the equation, an equation becomes: the impedance control voltage ANL_VOL=V1−V_REF. If the impedance values of the first resistor R1 and the second resistor R2 are the same and the impedance values of the third resistor R3 and the fourth resistor R4 are the same, the proportional constant h may be represented as the ratio of the first resistor R1 and the third resistor R3 (h=R1/R3), and the value of the proportional constant h may be controlled by controlling the impedance values of the first resistor R1 and the third resistor R3. For example, the impedance values of the first resistor R1 and the second resistor R2 may be 50 ohm and the impedance values of the third resistor R3 and the fourth resistor R4 may be 100 ohm, the proportional constant h becomes 0.5, and the impedance control voltage ANL_VOL has the value of 0.5*(V1−V_REF).

The voltage transfer unit 130 is configured to transfer the voltage of an impedance node (a ZQ node) to the first comparison unit 110 and the second comparison unit 120. In detail, the voltage transfer unit 130 may be configured to be a unit gain buffer with a voltage gain of 1, or more specifically a voltage follower. In particular, the voltage transfer unit 130 may include an op amp. When using an op amp, the voltage inputted to (+) terminal of the op amp and an output voltage of the op amp may be the same with each other. More specifically, the voltage transfer unit 130 transfers the voltage at the impedance node, i.e., the ZQ node, which is generated by a voltage distribution of the impedance units 410 and 420 and an external resistor R_ZQ connected to a calibration pad ZQ PAD, to the first comparison unit 110 and the second comparison unit 120. Additionally, the comparison circuit 100 may be designed without including the voltage transfer unit 130.

The counter unit 200 is configured to perform an operation (hereafter referred to as a 'counting operation') of increasing or decreasing a value of an impedance control code DGT_CODE<0:N> as digital signals constituted by N+1 bits in response to the up/down signal UP/DN as a digital signal. The counter unit 200 may be designed to perform the counting operation one time in each clock cycle in synchronization with a clock. The counting operation of the counter unit 200 is performed as follows. For example, when the impedance control code DGT_CODE<0:7> has been '10000000' and the voltage V1 at the impedance node is greater than the reference voltage V_REF, the counter unit 200 receives the up/down signal UP/DN with the logical value of 1, increases the value of the impedance control code DGT_CODE<0:7>, and outputs the impedance control code DGT_CODE<0:7> with a digital value of '10000001'. Conversely, when the impedance control code DGT_CODE<0:7> has been '10010001' and the voltage V1 at the impedance node is smaller than the reference voltage V_REF, the counter unit 200 receives the up/down signal UP/DN with the logical value of 0, decreases the value of the impedance control code DGT_CODE<0:7>, and outputs the impedance control code DGT_CODE<0:7> with a digital value of '10010000'. While the counting operation of the counter unit 200 is also controlled in response to a select signal SEL_SIG, the signal and a response of the counter unit 200 to the select signal SEL_SIG will be described in conjunction with the control unit 300.

The control unit 300 is configured to output N bits DGT_CODE<1:N> of the impedance control code to the first impedance unit 410 and output one of the impedance control voltage ANL_VOL and the remaining bit DGT_CODE<0> of the impedance control code to the second impedance unit 420. In detail, where the voltage V1 at the impedance node is out of a critical range, the remaining bit DGT_CODE<0> of the impedance control code is outputted to the second impedance unit 420 in response to the select signal SEL_SIG, and where the voltage V1 at the impedance node is within the critical range, the impedance control voltage ANL_VOL is outputted to the second impedance unit 420 in response to the select signal SEL_SIG. The critical range may be set to be greater than the level of the reference voltage V_REF and lower than the level of V_REF+α.

While FIG. 3 illustrates that N bits are outputted to the first impedance unit 410 and one bit is outputted to the second impedance unit 420, a design may be made such that M (M is a natural number satisfying 2≤M≤N) bits are outputted to the second impedance unit 420 and (N+1−M) bits are outputted to the first impedance unit 410. Hereafter, outputting any one of the zeroth bit DGT_CODE<0> and the impedance control voltage ANL_VOL to the second impedance unit 420 and outputting first to $N^{th}$ bits DGT_CODE<1:N> to the first impedance unit 410 is taken as an example for illustration purposes.

The control unit 300 activates and outputs the select signal SEL_SIG to the counter unit 200 when the voltage V1 at the impedance node is within the critical range, and the control unit 300 deactivates and outputs the select signal SEL_SIG to the counter unit 200 when the voltage V1 at the impedance node is out of the critical range. The counter unit 200 performs the counting operation for the impedance control code DGT_CODE<0:N> when the select signal SEL_SIG is deactivated, and the counter unit 200 interrupts the counting operation when the select signal SEL_SIG is activated. The counting operation is interrupted to prevent the impedance control code DGT_CODE<0:N> from being changed when the select signal SEL_SIG is activated. Namely, when the select signal SEL_SIG is activated, the counting operation of the counter unit 200 may be interrupted to ensure that the impedance value of the first impedance unit 410 is locked and the impedance value of the second impedance unit 420 may be changed by the impedance control voltage ANL_VOL.

The first impedance unit 410 terminates the impedance node with the impedance value that is determined by the first to $N^{th}$ bits DGT_CODE<1:N> of the impedance control code. The first impedance unit 410 may include a plurality of resistors that are connected in parallel to the impedance node. The plurality of resistors are turned on and off in response to the first to $N^{th}$ bits DGT_CODE<1:N> of the impedance control code. For example, if the first to $N^{th}$ bits DGT_CODE<1:N> of the impedance control code are changed from '1000000' to '1000001', a first resistor is turned off, the entire impedance value increases, and the voltage V1 at the impedance node decreases. Conversely, if the first to $N^{th}$ bits DGT_CODE<1:N> of the impedance control code are changed from '1000001' to '1000000', the first resistor is turned on, the entire impedance value decreases, and the voltage V1 at the impedance node increases.

The second impedance unit 420 terminates the impedance node with the impedance value that is determined by information selected between the zeroth bit DGT_CODE<0> of the impedance control code and the impedance control voltage ANL_VOL in response to the select signal SEL_SIG. The second impedance unit 420 may include one resistor that is connected in parallel to the impedance node, is turned on and off in response to the zeroth bit DGT_CODE<0> of the impedance control code when the voltage V1 at the impedance node is out of the critical range, and the impedance value of the second impedance unit 420 is changed in response to the impedance control voltage ANL_VOL when the voltage V1 at the impedance node is within the critical range.

In detail, if the impedance control code DGT_CODE<0> having a logical value of 1 is inputted to the second impedance unit 420, the second impedance unit 420 is turned off, the entire impedance value increases, and the voltage V1 at the impedance node decreases. Conversely, if the impedance control code DGT_CODE<0> having a logical value of 0 is inputted to the second impedance unit 420, the second impedance unit 420 is turned on, the entire impedance value decreases, and the voltage V1 at the impedance node increases.

Additionally, if the impedance control voltage ANL_VOL with a value between a ground voltage VSS and a power supply voltage VDD is inputted to the second impedance unit 420, a switch (a transistor) is not completely turned on, and thus a smaller amount of current than when the switch is completely turned on (that is, the logical signal of 0 is inputted) flows. More specifically, the impedance value of the second impedance unit 420 has a value between an impedance value when the switch is completely turned on (hereinafter referred to as 'RON') and an impedance value when the switch is completely turned off (hereinafter referred to as 'ROFF'). Depending upon the level of the inputted impedance control voltage ANL_VOL, the impedance value of the second impedance unit 420 may be changed in a range between RON and ROFF.

If the voltage V1 at the impedance node is greater than the reference voltage V_REF by 0.1V and the impedance control voltage ANL_VOL with the magnitude of 1*0.1V (when the proportional constant h is 1) is applied to the second impedance unit 420, the impedance value of the second impedance unit 420 is determined as a value that is smaller than ROFF and is greater than RON, and the entire impedance value of the impedance node increases to a lesser degree than when the second impedance unit 420 is completely turned off. As a result, the voltage V1 at the impedance node decreases to a lesser degree than when the second impedance unit 420 is completely turned off. Therefore, the voltage V1 at the impedance node may be more precisely controlled when the impedance control voltage ANL_VOL, which is an analog signal, is used than when the impedance control code DGT_CODE<0> as a digital signal is used.

Additionally, unlike FIG. 3, when the second impedance unit 420 receives M bits DGT_CODE<M−1:0> among the impedance control code or the impedance control voltage ANL_VOL, the second impedance unit 420 may be designed to include M number of resistors, and the M number of respective resistors may be turned on and off in response to the M number of bits DGT_CODE<M−1:0>, respectively, or the M number of respective resistors may be changed in response to the impedance control voltage ANL_VOL.

Figure 4:
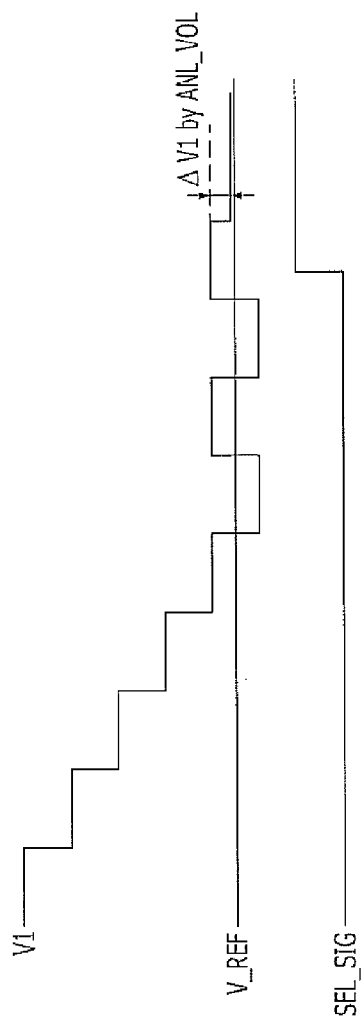
FIG. 4 illustrates a procedure where the voltage of an impedance node approaches a reference voltage by operations of the impedance control circuit shown in FIG. 3.

FIG. 4 illustrates a procedure where the voltage V1 at the impedance node approaches the reference voltage V_REF by the operations of the impedance control circuit shown in FIG. 3.

Hereinafter, operations of the impedance control circuit in accordance with the first embodiment of the present invention will be described with reference to FIG. 4. Current impedance control code DGT_CODE<0:7> are assumed to be '10000000', and the voltage V1 at the impedance node is greater than the reference voltage V_REF.

The comparison circuit 100 outputs the up/down signal UP/DN of 1 and outputs the impedance control voltage ANL_VOL with the magnitude of (V1−V_REF) when the voltage V1 at the impedance node and the reference voltage V_REF are inputted. The counter unit 200 receives the up/down signal UP/DN with a logical value of 1, increases the impedance control code DGT_CODE<0:N> by 1, and generates the impedance control code DGT_CODE<0:N> of '10000001'. The control unit 300 receives the impedance control code DGT_CODE<0:N> of '10000001' and the analog control voltage ANL_VOL with the magnitude of (V1−V_REF).

The control unit 300 detects whether the voltage V1 at the impedance node is within the critical range between the voltage level of the reference voltage V_REF and the voltage level of V_REF+α. If the voltage V1 at the impedance node is out of the critical range, for example, if the voltage V1 at the impedance node is greater than the voltage of V_REF+α, the control unit 300 deactivates the select signal SEL_SIG, outputs the first to seventh bits DGT_CODE<7:1> among the inputted impedance control code DGT_CODE<0:7> to the first impedance unit 410, and outputs the zeroth bit DGT_CODE<0> to the second impedance unit 420. The first impedance unit 410 turns off the seventh resistor and maintains the turned-on states of the remaining resistors in response to the inputted impedance control code DGT_CODE<7:1>, and the second impedance unit 420 turns off the zeroth resistor in response to the impedance control code DGT_CODE<0> with a logical value of 1, thereby increasing the entire impedance value of the impedance node and decreasing the voltage V1 at the impedance node.

While such a procedure is repeated, if the voltage V1 at the impedance node decreases to fall within the critical range, for example, if the voltage V1 at the impedance node has a value between V_REF and VREF+α, the control unit 300 activates the select signal SEL_SIG and outputs the impedance control voltage ANL_VOL with the magnitude of (V1−V_REF) to the second impedance unit 420 instead of the impedance control code DGT_CODE<0>. In response to the activated select signal SEL_SIG, the counter unit 200 interrupts the counting operation, and the value of the impedance control code DGT_CODE<0:N> is locked. The impedance value of the second impedance unit 420 is determined between RON and ROFF by the inputted impedance control voltage ANL_VOL. The entire impedance value of the impedance node increases to a lesser degree than when the second impedance unit 420 is completely turned off, and as a result, the voltage V1 at the impedance node decreases to a lesser degree than when the second impedance unit 420 is completely turned off.

Therefore, as shown in FIG. 4, the voltage V1 at the impedance node may approach the reference voltage V_REF more closely when the voltage V1 at the impedance node is controlled using the impedance control voltage ANL_VOL, which is an analog signal, than when the voltage V1 at the impedance node is controlled using the impedance control code DGT_CODE<0>, which is a digital signal.

Figure 5:
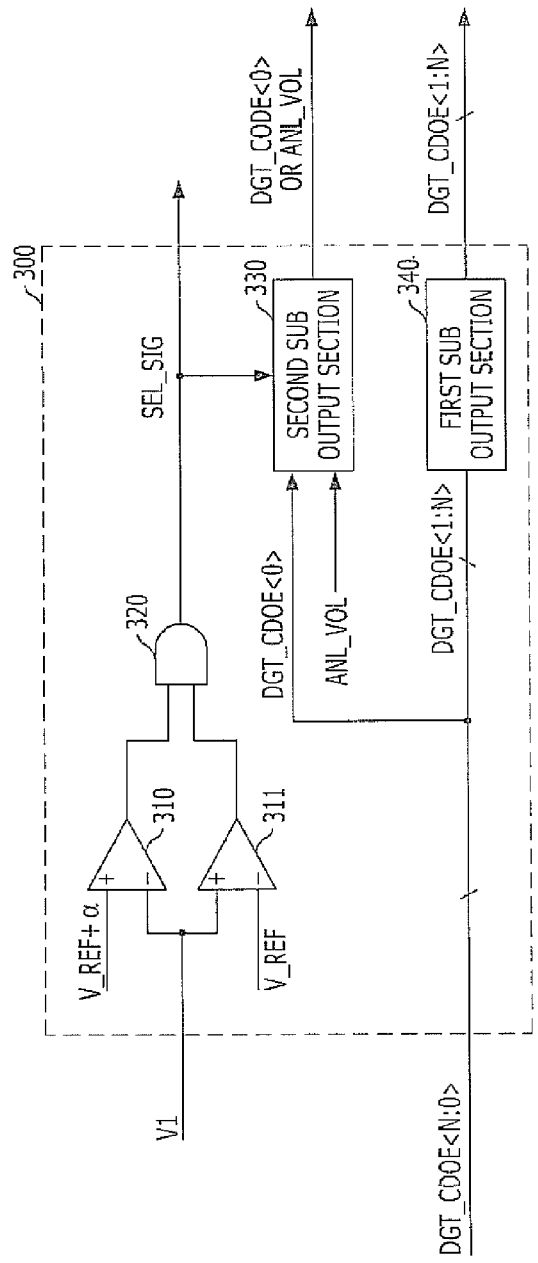
FIG. 5 illustrates a first exemplary embodiment of the control unit shown in FIG. 3.

FIG. 5 illustrates a first exemplary embodiment of the control unit 300 shown in FIG. 3.

Referring to FIG. 5, the control unit 300 may include a first sub comparison section 310, a second sub comparison section 311, a third sub comparison section 320, a first sub output section 340, and a second sub output section 330.

The first sub comparison section 310 is configured to compare the voltage with the level of V_REF+α and the voltage V1 at the impedance node. The second sub comparison section 311 is configured to compare the reference voltage V_REF and the voltage V1 at the impedance node. The third sub comparison section 320 is configured to compare output signals of the first sub comparison section 310 and the second sub comparison section 311 and activate the select signal SEL_SIG depending upon a comparison result. The first sub output section 340 is configured to output the first to N$^{th}$ bits DGT_CODE<1:N> of the impedance control code outputted from, the counter unit 200 to the first impedance unit 410 regardless of the select signal SEL_SIG, and the second sub output section 330 is configured to output any one of the zeroth bit DGT_CODE<0> of the impedance control code and the impedance control voltage ANL_VOL to the second impedance unit 420 in response to the select signal SEL_SIG.

For example, when the voltage V1 at the impedance node is V_REF+β (β>α), the second sub comparison section 311 outputs a logical value of 1 since the voltage V1 at the impedance node is greater than the reference voltage V_REF, and the first sub comparison section 310 outputs a logical value of 0 since the voltage V1 at the impedance node is greater than the voltage of V_REF+α. Since the logical values of 1 and 0 are inputted to the third sub comparison section 320, which may be constituted by an AND gate, the third sub comparison section 320 deactivates the select signal SEL_SIG to a logical value of 0. The first sub output section 340 outputs the first to N$^{th}$ bits DGT_CODE<1:N> of the impedance control code to the first impedance unit 410, and the second sub output section 330 outputs the zeroth bit DGT_CODE<0> of the impedance control code to the second impedance unit 420.

Conversely, when the voltage V1 at the impedance node is V_REF+Γ (0<Γ<α), the second sub comparison section 311 outputs a logical value of 1 since the voltage V1 at the impedance node is greater than the reference voltage V_REF, and the first sub comparison section 310 outputs a logical value of 1 since the voltage V1 at the impedance node is smaller than the voltage with the level of V_REF+α. Since the logical values of 1 and 1 are inputted to the third sub comparison section 320, the third sub comparison section 320 activates the select signal SEL_SIG to a logical value of 1. The first sub output section 340 outputs the first to N$^{th}$ bits DGT_CODE<1:N> of the impedance control code to the first impedance unit 410, and the second sub output section 330 outputs the impedance control voltage ANL_VOL to the second impedance unit 420.

The control unit 300 shown in FIG. 5 exemplifies that the critical range from a value that is greater than V_REF and is smaller than V_REF+α. Voltages to be inputted to the first sub comparison section 310 and the second sub comparison section 311 may be changed depending upon a designated critical range. For example, when a critical range is greater than V_REF−α and smaller than V_REF+α, the control unit 300 may be designed such that voltages to be inputted to the second sub comparison section 311 are V_REF−α and the voltage V1 at the impedance node, and voltages to be inputted to the first sub comparison section 310 are V_REF+α and the voltage V1 at the impedance node.

Figure 6:
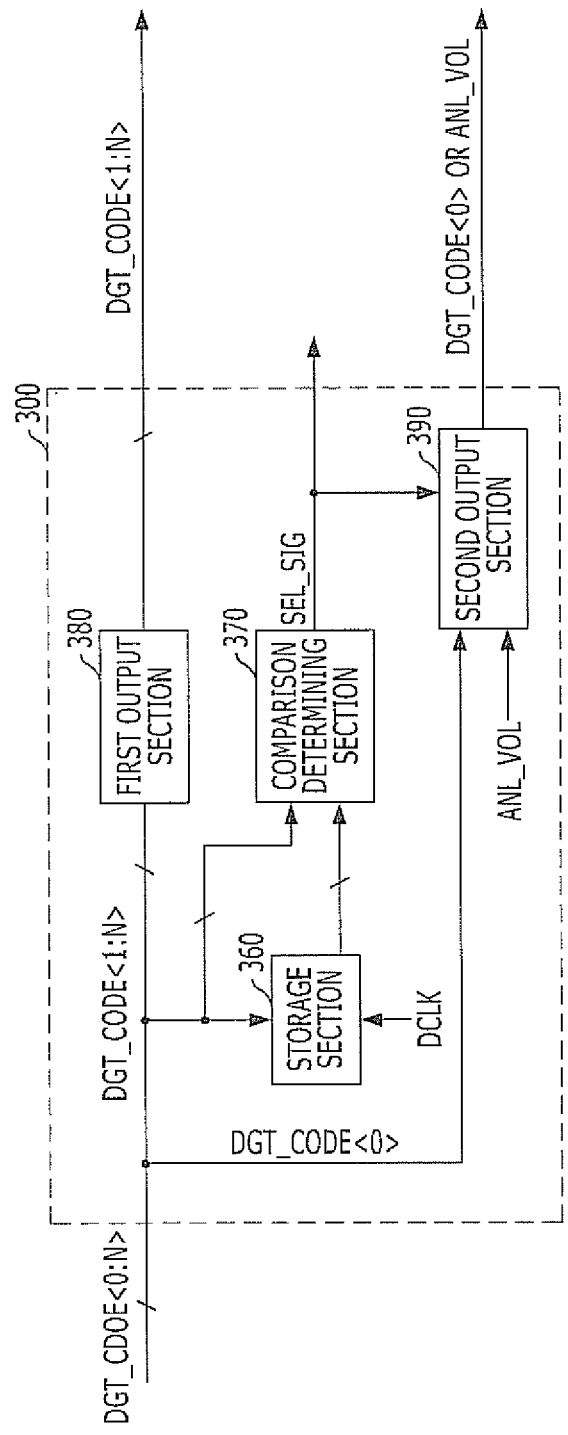
FIG. 6 illustrates a second exemplary embodiment of the control unit shown in FIG. 3.

FIG. 6 illustrates a second exemplary embodiment of the control unit 300 shown in FIG. 3.

Referring to FIG. 6, the control unit 300 may include a first output section 380, a storage section 360, a comparison determining section 370, and a second output section 390. To detect whether the voltage V1 at the impedance node is within the critical range, the control unit 300 shown in FIG. 6 compares previous and current impedance control codes DGT_CODE<0:N>. The configurations and operations of the first output section 380 and the second output section 390 are the same as those of the first sub output section 340 and the second sub output section 330 of FIG. 5.

The storage section 360 is configured to output a previously stored impedance control code DGT_CODE<0:N> to the comparison determining section 370 and store a current impedance control code DGT_CODE<0:N>, which are currently outputted from the counter unit 200. In detail, the previous impedance control code DGT_CODE<0:N>, which are stored one divided clock DCLK cycle before, are outputted to the comparison determining section 370, and the current impedance control code DGT_CODE<0:N>, which are outputted from the counter unit 200, are stored in synchronization with the divided clock DCLK. The divided clock DCLK is a clock that is generated by dividing a clock through a frequency divider, and the divided clock DCLK has a slow frequency. More specifically, a clock that has a frequency longer than a clock used in the counter unit 200. For example, the frequency of the divided clock DCLK used in the storage section 360 may be ½ times the frequency of the clock used in the counter unit 200.

The comparison determining section 370 is configured to compare the first to $N^{th}$ bits DGT_CODE<1:N> of the previous impedance control code stored in the storage section 360 and the first to $N^{th}$ bits DGT_CODE<1:N> of the current impedance control code outputted from the counter unit 200, and the comparison determining section 370 is configured to output the select signal SEL_SIG depending upon a comparison result. For example, if the first to $N^{th}$ bits DGT_CODE<1:N> of the previous impedance control code stored in the storage section 360 are '1000000', and the first to $N^{th}$ bits DGT_CODE<1:N> of the current impedance control code outputted from the counter unit 200 are '1000001', the voltage V1 at the impedance node is determined to be out of the critical range and the comparison determining section 370 deactivates the select signal SEL_SIG to a logical value of 0. This result is determined because the voltage V1 at the impedance node is in a state that is gradually decreasing toward the reference voltage V_REF. If the first to $N^{th}$ bits DGT_CODE<1:N> of the previous impedance control code stored in the storage section 360 are '1000001' and the first to $N^{th}$ bits DGT_CODE<1:N> of the current impedance control code outputted from the counter unit 200 are '1000001', the voltage V1 at the impedance node does not precisely become the level of the reference voltage V_REF and rises and falls in a stepwise manner with respect to the reference voltage V_REF. In this case, the voltage V1 at the impedance node is determined to fall within the critical range, and the comparison determining section 370 activates the select signal SEL_SIG to 1.

While the comparison determining section 370 has compared, for illustration purposes, the N number of bits DGT_CODE<1:N> of the previous and current impedance control codes to detect whether or not the voltage V1 at the impedance node is within the critical range, the comparison determining section 370 may compare T number of bits (T is a natural number satisfying 0<T<N).

Figure 7:
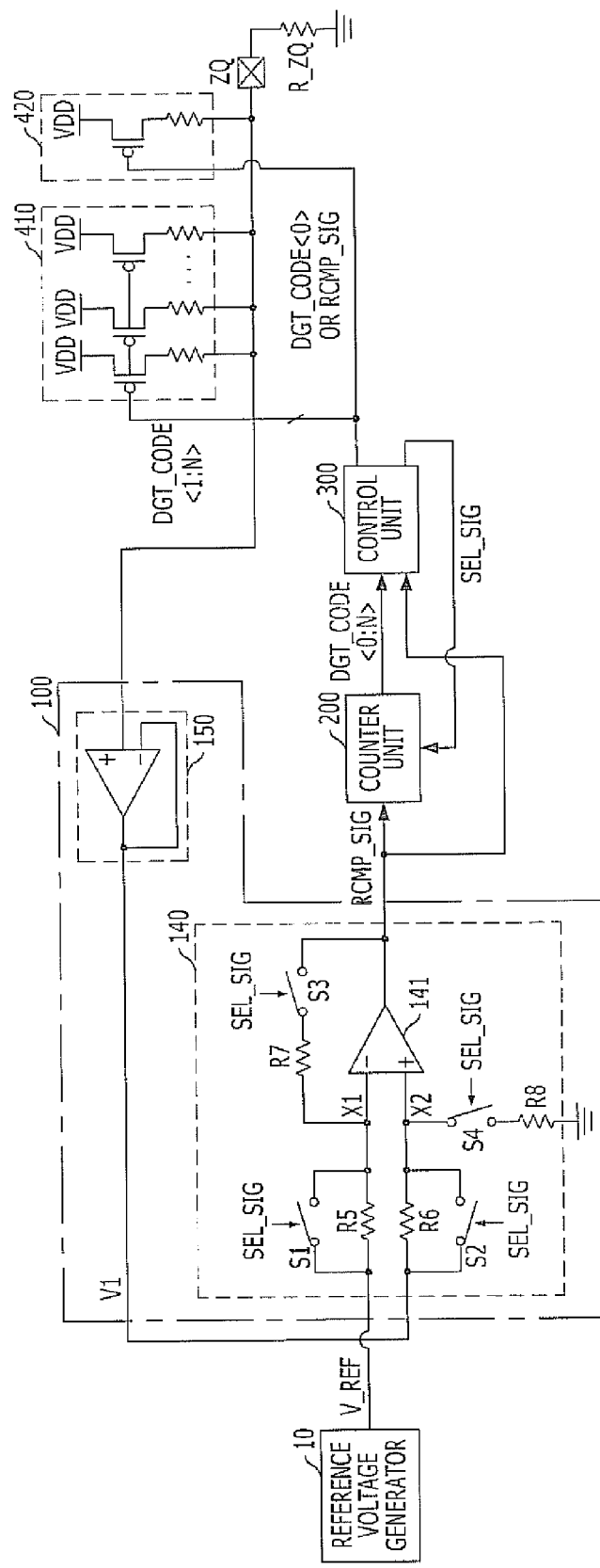
FIG. 7 illustrates an impedance control circuit in accordance with a second embodiment of the present invention.

FIG. 7 illustrates an impedance control circuit in accordance with a second embodiment of the present invention.

A comparison circuit 100' shown in FIG. 7 may include a comparison unit 140 and a voltage transfer unit 150. The comparison circuit 100' shown in FIG. 7 is distinguished from the comparison circuit 100 shown in FIG. 3 in that it includes one comparison unit 140. The comparison unit 140 may include one op amp 141, a plurality of resistors R5 to R8, and a plurality of switches S1 to S4. The comparison circuit 100' may be configured to output a digital signal with a logical value of 0 or 1 when a select signal SEL_SIG is deactivated and output an analog signal with a magnitude of (V1−V_REF) when the select signal SEL_SIG is activated.

In detail, the op amp 141 is configured to receive the voltage of a first node X1 and the voltage of a second node X2, amplify the difference between the two input signals, and generate and output a comparison result signal RCMP_SIG. A reference voltage V_REF is applied to a first end of a first resistor R5, and a second end of the first resistor R5 is connected with the first node X1. A first switch S1 is connected in parallel with the first resistor R5, is turned on when the select signal SEL_SIG is deactivated (that is, an inverted signal /SEL_SIG of the select signal SEL_SIG is activated), and is turned off when the select signal SEL_SIG is activated. A voltage V1 of an impedance node is applied to a first end of a second resistor R6, and a second end of the second resistor R6 is connected with the second node X2. A second switch S2 is connected in parallel with the second resistor R6, is turned on when the select signal SEL_SIG is deactivated (that is, the inverted signal /SEL_SIG of the select signal SEL_SIG is activated), and is turned off when the select signal SEL_SIG is activated. A first end of a third resistor R7 is connected with the first node X1, and a second end of the third resistor R7 is connected with a first end of a third switch 53. A first end of the third switch S3 is connected with the second end of the third resistor R7, and a second end of the third switch S3 is connected with the output terminal of the op amp 141 The third switch S3 is turned on when the select signal SEL_SIG is activated and is turned off when the select signal SEL_SIG is deactivated. A ground voltage is applied to a first end of a fourth resistor R8, and a second end of the fourth resistor R8 is connected with the first end of a fourth switch S4. A first end of the fourth switch S4 is connected with the second end of the fourth resistor R8, and a second end of the fourth switch 34 is connected with the second node X2. The fourth switch S4 is turned on when the select signal SEL_SIG is activated and is turned off when the select signal SEL_SIG is deactivated.

Operations of the comparison circuit 100' are as follows. In detail, when the select signal SEL_SIG is deactivated, the first and second switches S1 and S2 are turned on and the third and fourth switches S3 and S4 are turned off, and, as a result, the comparison unit 140 has the same structure as the first comparison unit 110 shown in FIG. 3. If the select signal SEL_SIG is deactivated, the comparison result signal RCMP_SIG outputted from the comparison unit 140 corresponds to the up/down signal UP/DN as the output signal of the first comparison unit 110, indicating which voltage of the two input voltages V1 and V_REF is greater. Conversely, when the select signal SEL_SIG is activated, the first and second switches S1 and S2 are turned off and the third and fourth switches S3 and S4 are turned on, and, as a result, the comparison unit 140 has the same structure as the second comparison unit 120 shown in FIG. 3. If the select signal SEL_SIG is activated, the comparison result signal RCMP_SIG outputted from the comparison unit 140 corresponds to the impedance control voltage ANL_VOL as the output signal of the second comparison unit 120 having the value corresponding to the difference between the voltage levels of the two input voltages V1 and V_REF.

The voltage transfer unit 150 is configured to transfer the voltage of an impedance node (a ZQ node) to the comparison unit 140. The configuration and operation of the voltage transfer unit 150 shown in FIG. 7 are the same as those of the voltage transfer unit 130 shown in FIG. 3. Additionally, the comparison circuit 100' may be designed without using the voltage transfer unit 150.

If the comparison circuit 100' is configured as shown in FIG. 7, the counter unit 200 performs a counting operation in response to the comparison result signal RCMP_SIG outputted from the comparison circuit 100'. When the select signal SEL_SIG is deactivated, the counter unit 200 performs the counting operation in response to the comparison result signal RCMP_SIG (corresponding to the up/down signal UP/DN shown in FIG. 3), and when the select signal SEL_SIG is activated, the counter unit 200 interrupts the counting operation.

The configuration and operation of the control unit 300 are the same as those of the control unit 300 of FIG. 3 except that the control unit 300 receives the comparison result signal RCMP_SIG instead of the impedance control voltage ANL_VOL. The control unit 300 is configured to detect whether or not the voltage V1 at the impedance node is within the critical range, output the impedance control code DGT_CODE<0:N> to first and second impedance units 410 and 420 when the voltage V1 at the impedance node is out of the critical range, and output first to $N^{th}$ bits DGT_CODE<1:N> of the impedance control code to the first impedance unit 410 and the comparison result signal RCMP_SIG corresponding to the impedance control voltage ANL_VOL of FIG. 3 to the second impedance unit 420 when the voltage V1 at the impedance node is within the critical range.

Remaining configurations and operations of the first and second impedance units 410 and 420 are the same as those of the first and second impedance units 410 and 420 shown in FIG. 3.

The first impedance unit 410 may be designed to terminate the impedance node using the impedance value that is determined in response to the impedance control code DGT_CODE<0:N>, and the second impedance unit 420 may be designed to terminate the impedance node using the impedance value that is determined in response to the impedance control voltage ANL_VOL. More specifically, when the voltage V1 at the impedance node is out of the critical range, the second impedance unit 420 is not used and the impedance node is terminated using the impedance value of the first impedance unit 410 that is determined by the impedance control code DGT_CODE<0:N>, and when the voltage V1 at the impedance node is within the critical range, the impedance value of the first impedance unit 410 is locked and only the impedance value of the second impedance unit 420 is changed by the impedance control voltage ANL_VOL.

While the impedance node has been described as being pull-up terminated, the impedance node may be pull-down terminated or may be both pull-up and pull-down terminated depending upon a termination regulation of a system to which an impedance control circuit is applied.

Figure 8:
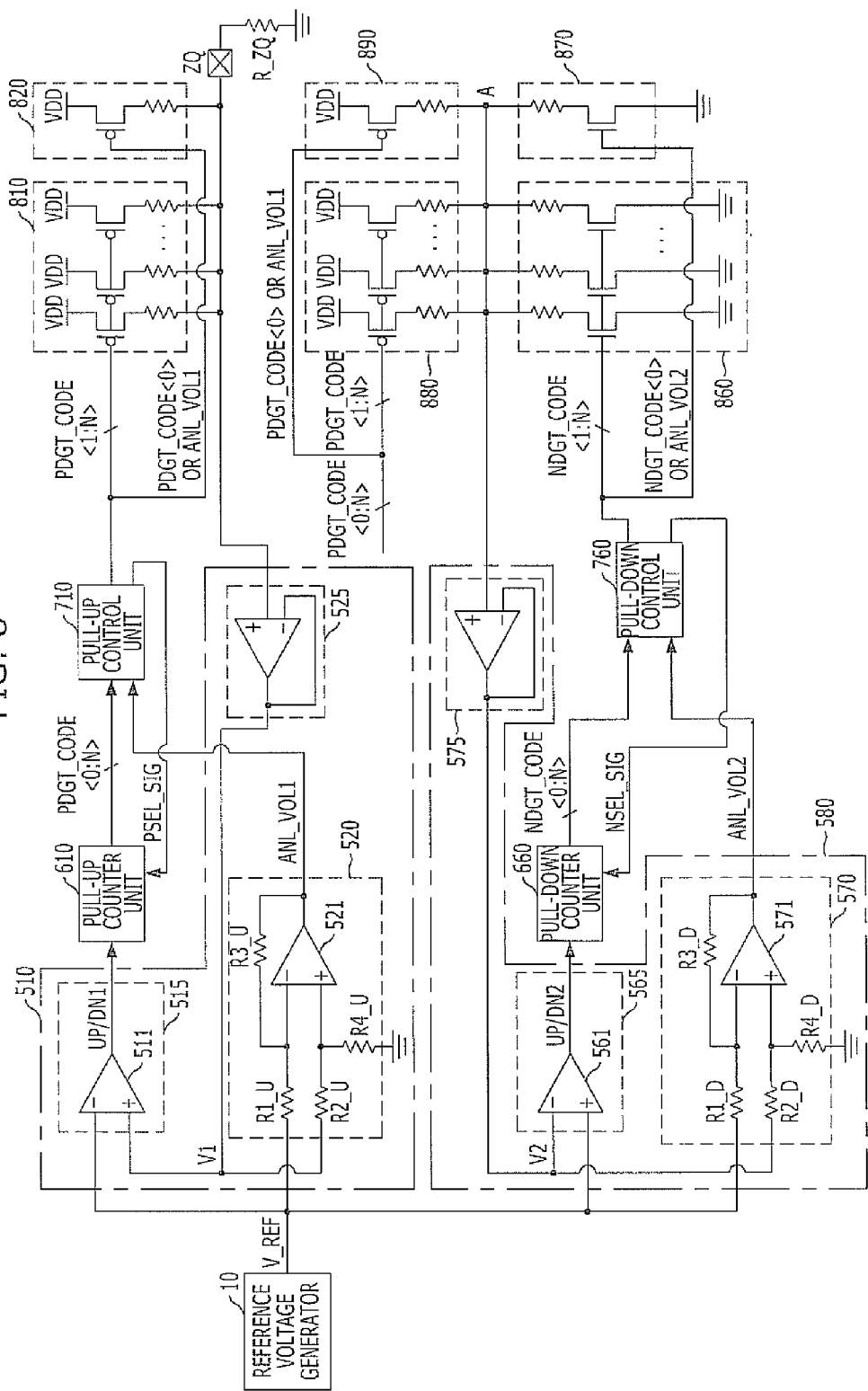
FIG. 8 illustrates an impedance control circuit that performs pull-up and pull-down termination operations, as an impedance control circuit in accordance with a third embodiment of the present invention.

FIG. 8 illustrates an impedance control circuit that performs pull-up and pull-down termination operations, as an impedance control circuit in accordance with a third embodiment of the present invention.

The impedance control circuit shown in FIG. 8 is distinguished from the impedance control circuit shown in FIG. 3 in that it performs pull-up and pull-down termination operations. To perform pull-up and pull-down termination operations, the impedance control circuit of FIG. 8 includes comparison circuits 510 and 580, counter units 610 and 660, control units 710 and 760, and impedance units 810, 820, 880, 890, 860 and 870 for the respective pull-up and pull-down termination operations. Only the differences between the impedance control circuit shown in FIG. 8 and the impedance control circuit shown in FIG. 3 will be described below in detail.

In FIG. 8, similar to FIG. 3, for illustration purposes, first to $N^{th}$ bits PDGT_CODE<1:N> of a pull-up impedance control code are outputted to a first pull-up impedance unit 810 and a zeroth bit PDGT_CODE<0> of the pull-up impedance control code is outputted to a second pull-up impedance unit 820, and first to $N^{th}$ bits NDGT_CODE<1:N> of a pull-down impedance control code are outputted to a first pull-down impedance unit 860 and a zeroth bit NDGT_CODE<0> of the pull-down impedance control code is outputted to a second pull-down impedance unit 870.

The impedance control circuit may include a pull-up comparison circuit 510, a pull-down comparison circuit 580, a pull-up counter unit 610, a pull-down counter unit 660, a pull-up control unit 710, a pull-down control unit 760, a first pull-up impedance unit 810, a second pull-up impedance unit 820, a first dummy impedance unit 880, a second dummy impedance unit 890, a first pull-down impedance unit 860, and a second pull-down impedance unit 870.

The configuration and operation of the pull-up comparison circuit 510 are similar to those of the comparison circuit 100 shown in FIG. 3 except that a first up/down signal UP/DN1 is generated and outputted to the pull-up counter unit 610 instead of the up/down signal UP/DN, a pull-up impedance control voltage ANL_VOL1 is generated and outputted to the pull-up control unit 710 instead of the impedance control voltage ANL_VOL, and first to fourth up resistors R1_U, R2_U, R3_U and R4_U are used instead of the first to fourth resistors R1, R2, R3 and R4. In detail, the pull-up comparison circuit 510 shown in FIG. 8 may include a first pull-up comparison unit 515, a second pull-up comparison unit 520, and a first voltage transfer unit 525. The configuration and operation of the first pull-up comparison unit 515 are similar to those of the first comparison unit 110 shown in FIG. 3, and the configuration and operation of the second pull-up comparison unit 520 are similar to those of the second comparison unit 120 shown in FIG. 3. Further, the configuration and operation of the first voltage transfer unit 525 are similar to those of the voltage transfer unit 130 shown in FIG. 3, and the pull-up comparison circuit 510 may be designed without using the first voltage transfer unit 525. Meanwhile, the pull-up comparison circuit 510 may be configured using one comparison unit, as in the comparison circuit 100 shown in FIG. 7.

The pull-up counter unit 610 is configured to perform a counting operation of increasing or decreasing the value of the pull-up impedance control code PDGT_CODE<0:N> in response to the first up/down signal UP/DN1, and the pull-up counter unit 610 is configured to interrupt the counting operation to prevent the value of the pull-up impedance control code PDGT_CODE<0:N> from being changed when a pull-up select signal PSEL_SIG is activated. The configuration and operation of the pull-up counter unit 610 are similar to those of the counter unit 200 shown in FIG. 3.

The pull-up control unit 710 is configured to output first to $N^{th}$ bits PDGT_CODE<1:N> of the pull-up impedance control code to the first pull-up impedance unit 810, output a zeroth bit PDGT_CODE<0> of the pull-up impedance control code to the second pull-up impedance unit 820 when the voltage V1 at the impedance node is out of a pull-up critical range, and output the pull-up impedance control voltage ANL_VOL1 to the second pull-up impedance unit 820 when the voltage V1 at the impedance node is within the pull-up critical range. The pull-up critical range may be designed to be greater than the voltage level of the reference voltage V_REF and lower than the voltage level of V_REF+α. The configuration and operation of the pull-up control unit 710 are similar to those of the control unit 300 shown in FIG. 3.

The first pull-up impedance unit 810 is configured to pull-up terminate the impedance node using the impedance value that is determined by the first to $N^{th}$ bits PDGT_CODE<1:N> of the pull-up impedance control code. The first pull-up impedance unit 810 may include a plurality of resistors that are connected in parallel to the impedance node and are turned on and off in response to the first to $N^{th}$ bits PDGT_CODE<1:N> of the pull-up impedance control code. The configuration and operation of the first pull-up impedance unit 810 are similar to those of the first impedance unit 410 shown in FIG. 3.

The second pull-up impedance unit 820 is configured to pull-up terminate the impedance node using the impedance value that is determined by the zeroth bit PDGT_CODE<0> of the pull-up impedance control code when the voltage V1 at the impedance node is out of the pull-up critical range, and the second pull-up impedance unit 820 is configured pull-up terminate the impedance node using the impedance value that is determined by the pull-up impedance control voltage ANL_VOL1 when the voltage V1 at the impedance node is within the pull-up critical range. The second pull-up impedance unit 820 may include one resistor that is connected in parallel to the impedance node. Also, the second pull-up impedance unit 820 is turned on and off in response to the inputted zeroth bit PDGT_CODE<0> of the pull-up impedance control code, or the impedance value of the second pull-up impedance unit 820 is changed in response to the inputted pull-up impedance control voltage ANL_VOL1. The configuration and operation of the second pull-up impedance unit 820 are similar to those of the second impedance unit 420 shown in FIG. 3.

The first dummy impedance unit 880 is configured in the same manner as the first pull-up impedance unit 810, and the first dummy impedance unit 880 receives the first to $N^{th}$ bits PDGT_CODE<1:N> of the pull-up impedance control code. The first dummy impedance unit 880 pull-up terminates a node A using the impedance value that is determined by the first to $N^{th}$ bits PDGT_CODE<1:N> of the pull-up impedance control code.

The second dummy impedance unit 890 is configured in the same manner as the second pull-up impedance unit 820, and the second dummy impedance unit 890 receives the zeroth bit PDGT_CODE<0> of the pull-up impedance control code when the voltage V1 at the impedance node is out of the pull-up critical range. The second dummy impedance unit 890 pull-up terminates the node A using the impedance value that is determined by the inputted zeroth bit PDGT_CODE<0> of the pull-up impedance control code. When the voltage V1 at the impedance node is within the pull-up critical range, the second dummy impedance unit 890 receives the pull-up impedance control voltage ANL_VOL1, and the second dummy impedance unit 890 pull-up terminates the node A using the impedance value that is determined by the inputted pull-up impedance control voltage ANL_VOL1. As a result, the impedance values of the first and second dummy impedance units 880 and 890 become the same as the impedance values of the first and second pull-up impedance units 810 and 820.

Thereafter, a pull-down impedance control operation is started using the pull-down comparison circuit 850, the pull-down counter unit 660, the pull-down control unit 760, the first pull-down impedance unit 860, and the second pull-down impedance unit 870. The pull-down impedance control operation is performed such that a voltage V2 of the node A becomes the same as the reference voltage V_REF, more specifically, the impedance values of the first and second pull-down impedance units 860 and 870 become the same as the impedance values of the first and second dummy impedance units 880 and 890.

The configuration and operation of the pull-down comparison circuit 580 are similar to those of the pull-up comparison circuit 510 except that the voltage V2 of the node A is compared with the reference voltage V_REF instead of the voltage V1 at the impedance node, a second up/down signal UP/DN2 is generated and outputted to the pull-down counter unit 660 instead of the first up/down signal UP/DN1, a pull-down impedance control voltage ANL_VOL2 is generated and outputted to the pull-down control unit 760 instead of the pull-up impedance control voltage ANL_VOL1, and first to fourth down resistors R1_D, R2_D, R3_D and R4_D are used instead of the first to fourth up resistors R1_U, R2_U, R3_U and R4_U. In detail, the pull-down comparison circuit 580 shown in FIG. 8 may include a first pull-down comparison unit 565, a second pull-down comparison unit 570, and a second voltage transfer unit 575. The configuration and operation of the first pull-down comparison unit 565 are similar to those of the first pull-up comparison unit 515, and the configuration and operation of the second pull-down comparison unit 570 are similar to those of the second pull-up comparison unit 520. The second voltage transfer unit 575 transfers the voltage of the node A to the first pull-down comparison unit 565 and the second pull-down comparison unit 570. The configuration and operation of the second voltage transfer unit 575 are similar to those of the first voltage transfer unit 525. The pull-down comparison circuit 580 may be designed without using the second voltage transfer unit 575. Meanwhile, the pull-down comparison circuit 580 may be configured using one comparison unit, as in the comparison circuit 100' shown in FIG. 7.

The pull-down counter unit 660 is configured to perform a counting operation of increasing or decreasing the value of the pull-down impedance control code NDGT_CODE<0:N> in response to the second up/down signal UP/DN2, and the pull-down counter unit 6660 is configured to interrupt the counting operation to prevent the value of the pull-down impedance control code NDGT_CODE<0:N> from being changed when a pull-down select signal NSEL_SIG is activated. The configuration and operation of the pull-down counter unit 660 are similar to those of the pull-up counter unit 610.

The pull-down control unit 760 is configured to output first to $N^{th}$ bits NDGT_CODE<1:N> of the pull-down impedance control code to the first pull-down impedance unit 860, output a zeroth bit NDGT_CODE<0> of the pull-down impedance control code to the second pull-down impedance unit 870 when the voltage V2 of the node A is out of a pull-down critical range, and output the pull-down impedance control voltage ANL_VOL2 to the second pull-down impedance unit 870 when the voltage V2 of the node A is within the pull-down critical range. The pull-down critical range may be designed to be greater than the voltage level of the reference voltage V_REF and lower than the voltage level of V_REF+α. The configuration and operation of the pull-down control unit 760 are similar to those of the pull-up control unit 710.

The first pull-down impedance unit 860 is configured to pull-down terminate the node A using the impedance value that is determined by the first to $N^{th}$ bits NDGT_CODE<1:N> of the pull-down impedance control code. The first pull-down impedance unit 860 may include a plurality of resistors that are connected in parallel to the node A and are turned on and off in response to the first to $N^{th}$ bits NDGT_CODE<1:N> of the pull-down impedance control code. For example, if the first to $N^{th}$ bits NDGT_CODE<1:N> of the pull-down impedance control code are changed from '0111111' to '0111110', a first resistor is turned off, the entire impedance value increases, and the voltage V2 of the node A increases. Conversely, if the first to $N^{th}$ bits NDGT_CODE<1:N> of the pull-down impedance control code are changed from '0111110' to '0111111', the first resistor is turned on, the entire impedance value decreases, and the voltage V2 of the node A decreases.

The second pull-down impedance unit 870 is configured to pull-down terminate the node A using the impedance value that is determined by the information selected between the zeroth bit NDGT_CODE<0> of the pull-down impedance control code and the pull-down impedance control voltage ANL_VOL2 in response to the pull-down select signal NSEL_SIG. The second pull-down impedance unit 870 may include one resistor that is connected in parallel to the node A, is turned on and off in response to the zeroth bit NDGT_CODE<0> of the pull-down impedance control code when the voltage V2 of the node A is out of the critical range, and is changed in the impedance value thereof in response to the pull-down impedance control voltage ANL_VOL2 when the voltage V2 of the node A is within the critical range.

In detail, if the pull-down impedance control code NDGT_CODE<0> having a logical value of 0 is inputted to the second pull-down impedance unit 870, the second pull-down impedance unit 870 is turned off, the entire impedance value increases, and the voltage V2 of the node A increases. Conversely, if the pull-down impedance control code NDGT_CODE<0> having a logical value of 1 is inputted to the second pull-down impedance unit 870, the second pull-down impedance unit 870 is turned on, the entire impedance value decreases, and the voltage V2 of the node A decreases. Additionally, if the pull-down impedance control voltage ANL_VOL2 with a value between a ground voltage VSS and a power supply voltage VDD is inputted to the second pull-down impedance unit 870, a switch (a transistor) is not completely turned on, and thus a smaller amount of current than when the switch is completely turned on (that is, the digital signal of 1 is inputted) flows. More specifically, the impedance value of the second pull-down impedance unit 870 has a value between an impedance value when the switch is completely turned on (hereinafter referred to as 'RON2') and an impedance value when the switch is completely turned off (hereinafter referred to as 'ROFF2'). Depending upon the level of the inputted pull-down impedance control voltage ANL_VOL2, the impedance value of the second pull-down impedance unit 870 may be changed between RON2 and ROFF2.

Figure 9:
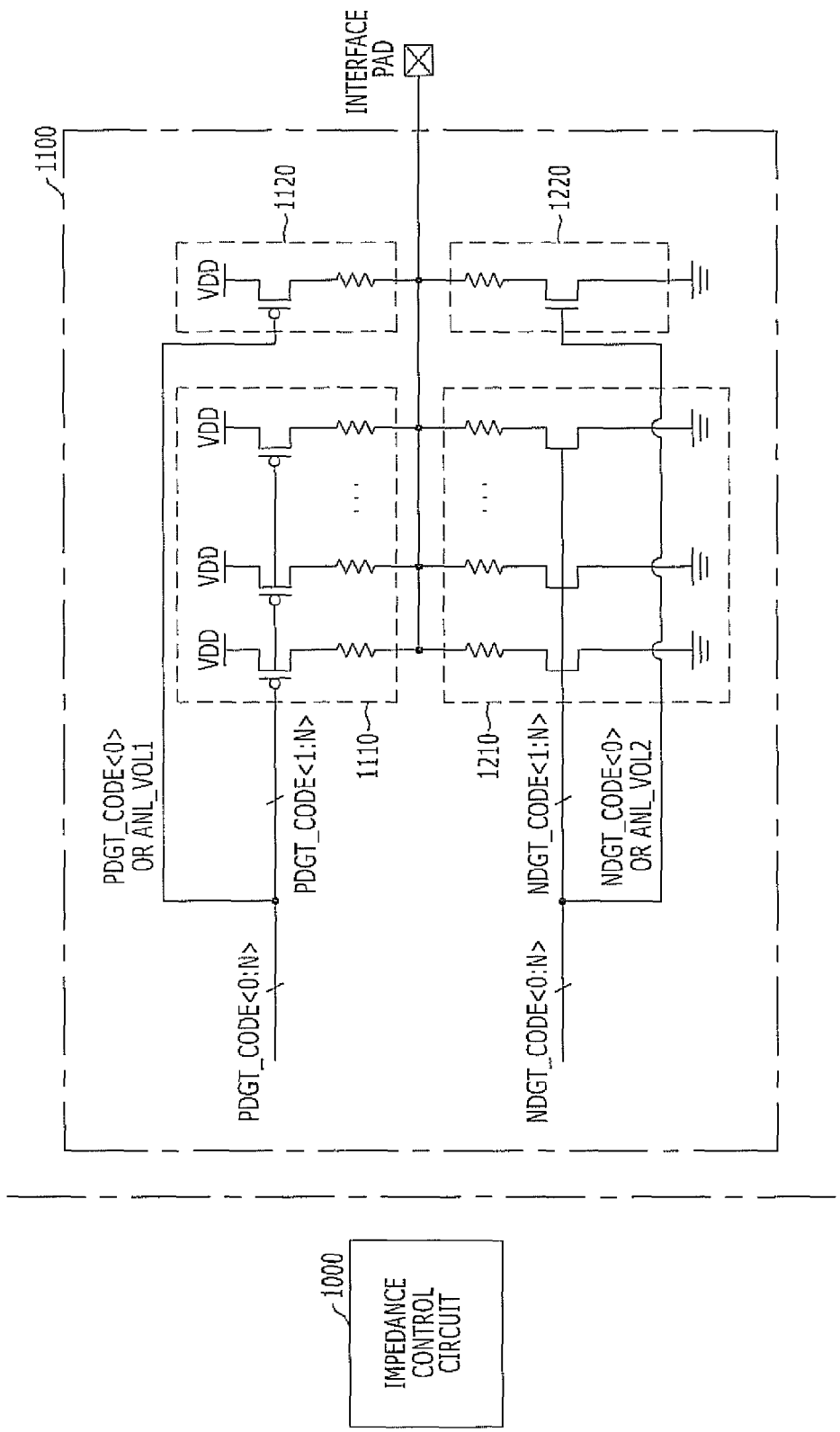
FIG. 9 illustrates an exemplary embodiment of a semiconductor device according to the present invention.

FIG. 9 illustrates an exemplary embodiment of a semiconductor device according to the present invention. FIG. 9 shows a semiconductor device that controls the termination impedance value of an interface pad INTERFACE PAD in response to impedance control codes PDGT_CODE<0:N> and NDGT_CODE<0:N> and impedance control voltages ANL_VOL1 and ANL_VOL2 generated by an impedance control circuit 1000.

The semiconductor device in accordance with the embodiment of the present invention includes the impedance control circuit 1000 and a termination circuit 1100.

The impedance control circuit 1000 may be configured in the same manner as the impedance control circuit shown in FIG. 8, and the impedance control circuit 1000 generates the impedance control codes PDGT_CODE<0:N> and NDGT_CODE<0:N> and the impedance control voltages ANL_VOL1 and ANL_VOL2. For illustration purposes, first to $N^{th}$ bits PDGT_CODE<1:N> of pull-up impedance control code are outputted to a first pull-up impedance unit 810 and a zeroth bit PDGT_CODE<0> of the pull-up impedance control code is outputted to a second pull-up impedance unit 820, and first to $N^{th}$ bits NDGT_CODE<1:N> of a pull-down impedance control code are outputted to a first pull-down impedance unit 860 and a zeroth bit NDGT_CODE<0> of the pull-down impedance control code is outputted to a second pull-down impedance unit 870.

The termination circuit 1100 has the same configuration as the first and second pull-up impedance units 810 and 820 and the first and second pull-down impedance units 860 and 870 of the impedance control circuit 1000, and the termination circuit 1100 terminates the interface pad INTERFACE PAD using the impedance value that is determined by the inputted impedance control codes PDGT_CODE<0:N> and NDGT_CODE<0:N> and the inputted impedance control voltages ANL_VOL1 and ANL_VOL2. The termination circuit 1100 may include a first pull-up termination unit 1110, a second pull-up termination unit 1120, a first pull-down termination unit 1210, and a second pull-down termination unit 1220.

The first pull-up termination unit 1110 is configured to pull-up terminate the interface pad INTERFACE PAD using the impedance value that is determined by the first to $N^{th}$ bits PDGT_CODE<1:N> of the pull-up impedance control code. The first pull-up termination unit 1110 may include a plurality of resistors that are connected in parallel to the interface pad INTERFACE PAD and are respectively turned on and off in response to the first to $N^{th}$ bits PDGT_CODE<1:N> of the pull-up impedance control code.

The second pull-up termination unit 1120 is configured to pull-up terminate the interface pad INTERFACE PAD using the impedance value that is determined by the zeroth bit PDGT_CODE<0> of the pull-up impedance control code when the zeroth bit PDGT_CODE<0> of the pull-up impedance control code is inputted, and pull-up terminate the interface pad INTERFACE PAD using the impedance value that is determined by the pull-up impedance control voltage ANL_VOL1 when the pull-up impedance control voltage ANL_VOL1 is inputted. The second pull-up termination unit 1120 may include one resistor that is connected in parallel to an input/output node. Also, the second pull-up termination unit 1120 is turned on and off in response to the zeroth bit PDGT_CODE<0> of the pull-up impedance control code, or the impedance value of the second pull-up termination unit is changed in response to the pull-up impedance control voltage ANL_VOL1.

The first pull-down termination unit 1210 is configured to pull-down terminate the interface pad INTERFACE PAD using the impedance value that is determined by the first to $N^{th}$ bits NDGT_CODE<1:N> of the pull-down impedance control code. The first pull-down termination unit 1210 may include a plurality of resistors that are connected in parallel to the input/output node and are respectively turned on and off in response to the first to $N^{th}$ bits NDGT_CODE<1:N> of the pull-down impedance control code.

The second pull-down termination unit 1220 is configured to pull-down terminate the interface pad INTERFACE PAD using the impedance value that is determined by the zeroth bit NDGT_CODE<0> of the pull-down impedance control code when the zeroth bit NDGT_CODE<0> of the pull-down impedance control code is inputted, and pull-down terminate the interface pad INTERFACE PAD using the impedance value that is determined by the pull-down impedance control voltage ANL_VOL2 when the pull-down impedance control voltage ANL_VOL2 is inputted. The second pull-down termination unit 1220 may include one resistor that is connected in parallel to the interface pad INTERFACE PAD. Also, the second pull-down termination unit 1220 is turned on and off in response to the zeroth bit NDGT_CODE<0> of the pull-down impedance control code, or the impedance value of the second pull-down termination unit 1220 is changed in response to the pull-down impedance control voltage ANL_VOL2.

Operations of the semiconductor device in accordance with the embodiment of the present invention shown in FIG. 9 will be described below.

For illustration purposes, the voltage V1 at the impedance node is controlled by the first to $N^{th}$ bits PDGT_CODE<1:N> and NDGT_CODE<1:N> of the impedance control code and the impedance control voltages ANL_VOL1 and ANL_VOL2. By the impedance controlling operation of the impedance control circuit 1000, the impedance control codes PDGT_CODE<0:N> and NDGT_CODE<0:N> and the impedance control voltage ANL_VOL1 and ANL_VOL2 are generated. The impedance controlling operation of the impedance control circuit 1000 is the same as the impedance controlling operation as described above with reference to FIGS. 3 and 8. Through transmission lines, the first to $N^{th}$ bits PDGT_CODE<1:N> of the pull-up impedance control code are inputted to the first pull-up termination unit 1110, the pull-up impedance control voltage ANL_VOL1 is inputted to the second pull-up termination unit 1120, the first to $N^{th}$ bits NDGT_CODE<1:N> of the pull-down impedance control code are inputted to the first pull-down termination unit 1210, and the pull-down impedance control voltage ANL_VOL2 is inputted to the second pull-down termination unit 1220.

The impedance value of the first pull-up termination unit 1110 is controlled by a plurality of resistors that are turned on and off in response to the first to $N^{th}$ bits PDGT_CODE<1:N> of the pull-up impedance control code, and the impedance value of the second pull-up termination unit 1120 is determined by the pull-up impedance control voltage ANL_VOL1 to be greater than RON and smaller than ROFF. The interface pad INTERFACE PAD is pull-up terminated by the impedance value of the first pull-up termination unit 1110 and the impedance value of the second pull-up termination unit 1120. The impedance value of the first pull-down termination unit 1210 is determined by a plurality of resistors which are turned on and off in response to the first to $N^{th}$ bits NDGT_CODE<1:N> of the pull-down impedance control code, and the impedance value of the second pull-down termination unit 1220 is determined by the pull-down impedance control voltage ANL_VOL2 to be greater than RON and smaller than ROFF. The interface pad INTERFACE PAD is pull-down terminated by the impedance value of the first pull-down termination unit 1210 and the impedance value of the second pull-down termination unit 1220.

The target values of the pull-up termination units 1110 and 1120 and the pull-down termination units 1210 and 1220 of the termination circuit 1100 are not necessarily the same as the impedance values of the pull-up impedance units 810 and 820 and the pull-down impedance units 860 and 870 of the impedance control circuit 1000, and may be values corresponding to ½ times or ¼ times the impedance values.

While the semiconductor device in accordance with the embodiment of the present invention shown in FIG. 9 exemplifies that the interface pad INTERFACE PAD is pull-up and pull-down terminating, a design may be made such that the interface pad INTERFACE PAD is only pull-up terminated or only pull-down terminated according to the termination regulation of a system to which the semiconductor device according to the embodiment of the present invention is applied. As a result, the termination circuit 1100 may be configured to include only the pull-up termination units 1110 and 1120 or only the pull-down termination units 1210 and 1220.

As is apparent from the above descriptions, impedance may be precisely controlled while using a reduced circuit area, and the signal integrity of a system to which an impedance control circuit is applied may be improved.

While the present invention has been described with respect to the specific embodiments, it will be apparent to those skilled in the art that various changes and modifications may be made without departing from the spirit and scope of the invention as defined in the following claims.

What is claimed is:

1. An impedance control circuit comprising:
    a comparison circuit configured to:
        compare a voltage level of an impedance node with a reference voltage,
        generate an up/down signal indicating whether the voltage at the impedance node is greater or less than the reference voltage, and
        generate an impedance control voltage that has a voltage level corresponding to a difference between the voltage at the impedance node and the reference voltage;
    a counter unit configured to increase or decrease a value of an impedance control code having N+1 bits based on the up/down signal;
    a first impedance unit configured to terminate an impedance node using an impedance value that is based on N bits of the impedance control code; and
    a second impedance unit configured to:
        terminate the impedance node using an impedance value based on a single bit, of the N+1 bits, of the impedance control code, if the voltage at the impedance node is less than or equal to the reference voltage or greater than or equal to the reference voltage plus a voltage equal to a change in the voltage at the impedance node produced by a bang-bang error, and
        terminate the impedance node using an impedance value based on the impedance control voltage, if the voltage at the impedance node is greater than the reference voltage and less than the reference voltage plus a voltage equal to a change in the voltage at the impedance node produced by a bang-bang error.

2. An impedance control circuit comprising:
    a comparison circuit configured to:
        compare a voltage level of an impedance node with of a reference voltage, generate an up/down signal indicating whether the voltage at the impedance node is greater or less than the reference voltage, and generate an impedance control voltage that has a voltage level corresponding to a difference between the voltage at the impedance node and the reference voltage;

a counter unit configured to increase or decrease a value of an impedance control code based on to the up/down signal;

a first impedance unit configured to terminate an impedance node using an impedance value that is based on N bits of the impedance control code; and a second impedance unit configured to:

terminate the impedance node using an impedance value based on a single bit, of the N+1 bits, of the impedance control code, if the voltage at the impedance node is less than or equal to the reference voltage or greater than or equal to the reference voltage plus a voltage equal to a change in the voltage at the impedance node produced by a bang-bang error, and terminate the impedance node using an impedance value based on the impedance control voltage, if the voltage at the impedance node is greater than the reference voltage and less than the reference voltage plus a voltage equal to a change in the voltage at the impedance node produced by a bang-bang error.

3. The impedance control circuit of claim 1, wherein the first impedance unit includes a plurality of resistors that are connected in parallel to the impedance node and are turned on and off based on the N bits of the impedance control code.

4. The impedance control circuit of claim 1, wherein the second impedance unit includes:

at least one resistor that is connected in parallel to the impedance node, wherein the at least one resistor is turned on and off based on to the single bit of the impedance control code, if the voltage at the impedance node is less than or equal to the reference voltage or greater than or equal to the reference voltage plus the voltage equal to the change in the voltage at the impedance node produced by the bang-bang error, and wherein an impedance value of the second impedance unit is changed based on the impedance control voltage having N+1 bits, if the voltage at the impedance node is greater than the reference voltage and less than the reference voltage plus the voltage equal to the change in the voltage at the impedance node produced by the bang-bang error.

5. The impedance control circuit of claim 1, wherein the counter unit is to:

increase or decrease the value of the impedance control code, if the voltage at the impedance node is less than or equal to the reference voltage or greater than or equal to the reference voltage plus the voltage equal to the change in the voltage at the impedance node produced by the bang-bang error, and interrupt the the increasing or the decreasing the value of the impedance control code, if the voltage at the impedance node is greater than the reference voltage and less than the reference voltage plus the voltage equal to the change in the voltage at the impedance node produced by the bang-bang error.

6. The impedance control circuit of claim 1, further comprising:

a control unit configured to:

output the N bits of the impedance control code to the first impedance unit, output the single bit of the impedance control code to the second impedance unit, if the voltage at the impedance node is less than or equal to the reference voltage or greater than or equal to the reference voltage plus the voltage equal to the change in the voltage at the impedance node produced by the bang-bang error, and output the impedance control voltage to the second impedance unit, if the voltage at the impedance node is greater than the reference voltage and less than the reference voltage plus the voltage equal to the change in the voltage at the impedance node produced by the bang-bang error.

7. The impedance control circuit of claim 6, wherein the control unit comprises:

a first output section configured to:

receive the N bits of the impedance control code having N+1 bits, and output the N bits to the first impedance unit;

a storage section configured to store the impedance control code having N+1 bits;

a comparison determining section configured to:

compare a previous impedance control code, stored in the storage section, to the impedance control code having N+1 bits that is outputted from the counter unit, and output a select signal based on the comparison; and a second output section configured to:

output, based on the select signal, the single bit of the impedance control code having N+1 bits to the second impedance unit or the impedance control voltage to the second impedance unit.

8. The impedance control circuit of claim 7, wherein the select signal is deactivated if the previous impedance control code and the impedance control code having N+1 are different when compared to each other, and the select signal is activated if the previous impedance control code and the impedance control code having N+1 bits are the same when compared to each other.

9. The impedance control circuit of claim 6, wherein the control unit comprises:

a first sub-comparison section configured to compare the reference voltage plus the voltage equal to the change in the voltage at the impedance node produced by the bang-bang error to the voltage at the impedance node;

a second sub-comparison section configured to compare the reference voltage to the voltage at the impedance node;

a third comparison section configured to compare an output signal of the first sub comparison section to an output signal of the second sub comparison section, and output a select signal based on the comparison;

a first output section configured to:

receive the N bits of the impedance control code having N+1 bits from the counter unit, and output the N bits to the first impedance unit; and a second sub output section configured to:

output, in response to the select signal, the single bit of the impedance control code having N+1 bits to the second impedance unit or the impedance control voltage to the second impedance unit.

10. The impedance control circuit of claim 1, wherein the comparison circuit comprises a first comparison unit and a second comparison unit, wherein the first comparison unit comprises a first operational amplifier that receives the voltage at the impedance node and the reference voltage, and wherein the second comparison unit comprises:
a second operational amplifier configured to receive a voltage at a first node and a voltage at a second node;
a first resistor having a first end to which the reference voltage is applied and a second end that is connected with the first node;
a second resistor having a first end to which the voltage at the impedance node is applied and a second end that is connected with the second node;
a third resistor having a first end that is connected with the first node and a second end that is connected with an output terminal of the second operational amplifier; and
a fourth resistor having a first end to which a ground voltage is applied and a second end that is connected with the second node.

11. The impedance control circuit of claim 1, wherein the comparison circuit comprises:
an operational amplifier configured to receive a voltage of a first node and a voltage of a second node through the respective inputs of the operational amplifier;
a first resistor having a first end to which the reference voltage is applied and a second end that is connected with the first node;
a first switch connected in parallel to the first resistor and configured to be turned on if a select signal is deactivated;
a second resistor having a first end to which the voltage at the impedance node is applied and a second end that is connected with the second node;
a second switch connected in parallel to the second resistor and configured to be turned on if the select signal is deactivated;
a third resistor having a first end that is connected with the first node;
a third switch having a first end that is connected with the second end of the third resistor and a second end that is connected with an output terminal of the operational amplifier, and the third switch is configured to be turned on if the select signal is activated;
a fourth resistor having a first end to which a ground voltage is applied; and
a fourth switch having a first end that is connected with the second end of the fourth resistor and a second end that is connected with the second node, and the fourth switch configured to be turned on if the select signal is activated.

12. The impedance control circuit of claim 11, wherein the first to fourth resistors have a same impedance value.

13. An impedance control circuit comprising:
a first pull-up impedance unit configured to pull-up drive an impedance node using an impedance value that is determined by a pull-up impedance control code;
a second pull-up impedance unit configured to pull-up drive the impedance node using an impedance value that is determined by a pull-up impedance control voltage;
a first dummy pull-up impedance unit configured in the same manner as the first pull-up impedance unit to pull-up drive a first node;
a second dummy pull-up impedance unit configured in the same manner as the second pull-up impedance unit to pull-up drive the first node;
a first pull-down impedance unit configured to pull-down drive the first node using an impedance value that is determined by a pull-down impedance control code;
a second pull-down impedance unit configured to pull-down drive the first node using an impedance value that is determined by a pull-down impedance control voltage;
a pull-up comparison circuit configured to compare a voltage level of the impedance node and a voltage level of a reference voltage, generate a first up/down signal indicating whether the voltage at the impedance node is greater than the reference voltage, and generate the pull-up impedance control voltage that has a voltage level corresponding to a difference between the voltage at the impedance node and the reference voltage;
a pull-down comparison circuit configured to compare a voltage level of the first node and the voltage level of the reference voltage, generate a second up/down signal indicating whether the voltage at the first node is greater than the reference voltage, and generate the pull-down impedance control voltage that has a voltage level corresponding to a difference between the voltage of the first node and the reference voltage;
a pull-up counter unit configured to increase or decrease a value of the pull-up impedance control code in response to the first up/down signal; and
a pull-down counter unit configured to increase or decrease a value of the pull-down impedance control code in response to the second up/down signal.

14. An impedance control circuit comprising:
a first pull-up impedance unit configured to pull-up drive an impedance node using an impedance value that is determined by a first group of bits of a pull-up impedance control code;
a second pull-up impedance unit configured to pull-up drive the impedance node using an impedance value that is determined in response to one of a remaining bit of the pull-up impedance control code not included in the first group of bits of the pull-up impedance control code and a pull-up impedance control voltage;
a first dummy pull-up impedance unit configured in the same manner as the first pull-up impedance unit to pull-up drive a first node;
a second dummy pull-up impedance unit configured in the same manner as the second pull-up impedance unit to pull-up drive the first node;
a first pull-down impedance unit configured to pull-down drive the first node using an impedance value that is determined by a first group of bits of a pull-down impedance control code;
a second pull-down impedance unit configured to pull-down drive the first node using an impedance value that is determined in response to one of a remaining bit of the pull-down impedance control code not included in the first group of bits of the pull-down impedance control code and a pull-down impedance control voltage;
a pull-up comparison circuit configured to compare a voltage level of the impedance node and a voltage level of a reference voltage, generate a first up/down signal indicating whether the voltage at the impedance node is greater than the reference voltage, and generate the pull-up impedance control voltage that has a voltage level corresponding to a difference between the voltage at the impedance node and the reference voltage;
a pull-down comparison circuit configured to compare a voltage level of the first node and the level of the reference voltage, generate a second up/down signal indicating whether the voltage at the first node is greater than the reference voltage, and generate the pull-down impedance control voltage that has a voltage level corresponding to a difference between the voltage of the first node and the reference voltage;
a pull-up counter unit configured to increase or decrease a value of the pull-up impedance control code in response to the first up/down signal; and
a pull-down counter unit configured to increase or decrease a value of the pull-down impedance control code in response to the second up/down signal.

15. The impedance control circuit of claim 14, wherein the second pull-up impedance unit is controlled in response to the remaining bit of the pull-up impedance control code when the voltage at the impedance node is out of a pull-up critical range, and the second pull-up impedance unit is controlled in response to the pull-up impedance control voltage when the voltage at the impedance node is within the pull-up critical range,
wherein the second pull-down impedance unit is controlled in response to the remaining bit of the pull-down impedance control code when the voltage of the first node is out of a pull-down critical range, and the second pull-down impedance unit is controlled in response to the pull-down impedance control voltage when the voltage of the first node is within the pull-down critical range.

16. The impedance control circuit of claim 14,
wherein the pull-up counter unit performs an operation of increasing or decreasing the value of the pull-up impedance control code when the voltage at the impedance node is out of the pull-up critical range, and interrupts the operation of increasing or decreasing the value of the pull-up impedance control code when the voltage at the impedance node is within the pull-up critical range, and
wherein the pull-down counter unit performs an operation of increasing or decreasing the value of the pull-down impedance control code when the voltage at the impedance node is out of the pull-down critical range, and interrupts the operation of increasing or decreasing the value of the pull-down impedance control code when the voltage at the impedance node is within the pull-down critical range.

17. The impedance control circuit of claim 14, further comprising:
a pull-up control unit configured to output the first group of bits of the pull-up impedance control code to the first pull-up impedance unit, output the remaining bit of the pull-up impedance control code to the second pull-up impedance unit when the voltage at the impedance node is out of the pull-up critical range, and output the pull-up impedance control voltage to the second pull-up impedance unit when the voltage at the impedance node is within the pull-up critical range; and
a pull-down control unit configured to output the first group of bits of the pull-down impedance control code to the first pull-down impedance unit, output the remaining bit of the pull-down impedance control code to the second pull-down impedance unit when the voltage of the first node is out of the pull-down critical range, and output the pull-down impedance control voltage to the second pull-down impedance unit when the voltage of the first node is within the pull-down critical range.

18. The impedance control circuit of claim 15, wherein the pull-up critical range is a range between a voltage that is greater than the voltage level of the reference voltage and a voltage that is less than a voltage level that is greater by a first value than the reference voltage, and the pull-down critical range a range between a voltage that is greater than voltage the level of the reference voltage and a voltage that is less than a voltage level that is greater by the first value than the reference voltage.

19. A semiconductor device comprising:
an impedance control circuit configured to:
generate an impedance control code having N+1 bits, and
generate an impedance control voltage; and
a termination circuit configured to:
terminate an interface pad using an impedance value based on the impedance control code having N+1 bits and the impedance control voltage,
wherein the impedance control circuit comprises:
a comparison circuit configured to:
compare a voltage level of an impedance node with a reference voltage,
generate an up/down signal indicating whether the voltage at the impedance node is greater or less than the reference voltage, and
generate the impedance control voltage, wherein the impedance control voltage has a voltage level corresponding to a difference between the voltage at the impedance node and the reference voltage,
a counter unit configured to increase or decrease a value of the impedance control code having N+1 bits based on the up/down signal,
a first impedance unit configured to terminate an impedance node using an impedance value that is based on N bits of the impedance control code, and
a second impedance unit configured to:
terminate the impedance node using an impedance value based on a single bit, of the N+1 bits, of the impedance control code, if the voltage at the impedance node is less than or equal to the reference voltage or greater than or equal to the reference voltage plus a voltage equal to a change in the voltage at the impedance node produced by a bang-bang error, and
terminate the impedance node using an impedance value based on the impedance control voltage, if the voltage at the impedance node is greater than the reference voltage and less than the reference voltage plus a voltage equal to a change in the voltage at the impedance node produced by a bang-bang error.

20. The semiconductor device of claim 19,
wherein the first impedance unit includes a plurality of resistors that are connected in parallel to the impedance node and are turned on and off of the impedance control code, and
wherein the second impedance unit includes:
at least one resistor that is connected in parallel to the impedance node, wherein the at least one resistor is turned on and off based on the single bit of the impedance control code having N+1 bits, if the voltage at the impedance node is less than or equal to the reference voltage or greater than or equal to the reference voltage plus the voltage equal to the change in the voltage at the impedance node produced by the bang-bang error, and
wherein is changed in an impedance value of the second impedance unit is changed based on to the impedance control voltage, if the voltage at the impedance node is greater than the reference voltage and less than the reference voltage plus the voltage equal to the change in the voltage at the impedance node produced by the bang-bang error.

21. The semiconductor device of claim 19, wherein the termination circuit comprises:
a first termination unit configured to terminate the interface pad using an impedance value based on the N bits of the impedance control code having N+1 bits; and
a second termination unit configured to:
terminate the interface pad using an impedance value based on the single bit of the impedance control code having N+1 bits, if the single bit of the impedance control code having N+1 bits is inputted, or
terminate the interface pad using an impedance value that is based on the impedance control voltage, if the impedance control voltage is inputted.

22. The semiconductor device of claim 21,
wherein the first termination unit includes a plurality of resistors that are connected in parallel to the interface pad and are turned on and off based on the N bits of the impedance control code having N+1 bits, and
wherein the second termination unit includes at least one resistor that is connected in parallel to the interface pad, and is turned on and off based on the single bit of the impedance control code having N+1 bits or is changed in an impedance value based on the impedance control voltage.

23. An impedance control circuit comprising:
a comparison circuit configured to:
compare a voltage level of an impedance node with of a reference voltage,
generate an up/down signal indicating whether the voltage at the impedance node is greater or less than the reference voltage, and
generate an impedance control voltage having a voltage level corresponding to a difference between the voltage levels of the impedance node and the reference voltage;
a counter unit configured to increase or decrease a value of an impedance control code having N+1 bits based on the up/down signal;
a first impedance unit configured to terminate an impedance node using an impedance value that is based on N+1−M (wherein $2 \leq M \leq M$) bits of the impedance control code; and
a second impedance unit configured to:
terminate the impedance node using an impedance value based on M bits of the impedance control code, if the voltage at the impedance node is less than or equal to the reference voltage or greater than or equal to the reference voltage plus a voltage equal to a change in the voltage at the impedance node produced by a bang-bang error, and
terminate the impedance node using an impedance value based on the impedance control voltage, if the voltage at the impedance node is greater than the reference voltage and less than the reference voltage plus a voltage equal to a change in the voltage at the impedance node produced by a bang-bang error.

24. The impedance control circuit of claim 23, wherein the second impedance unit is controlled based on the M bits of the impedance control code, if the voltage at the impedance node is less than or equal to the reference voltage or greater than or equal to the reference voltage plus the voltage equal to the change in the voltage at the impedance node produced by the bang-bang error.

* * * * *